United States Patent [19]

Imose et al.

[11] Patent Number: 4,518,962
[45] Date of Patent: May 21, 1985

[54] DEVICE FOR TRANSMITTING MEASUREMENT DATA FROM A ROTATING BODY

[75] Inventors: Kazuo Imose, Ashiya; Kiyoshi Yamamuro, Kokubunji; Hironori Takeuchi, Tachikawa; Takashi Misawa, Tokyo, all of Japan

[73] Assignees: Teijin Limited; Fuji Electric Co., Ltd., both of Japan

[21] Appl. No.: 331,552

[22] Filed: Dec. 17, 1981

[51] Int. Cl.³ .................. H05K 1/11; H05K 1/14; H05K 7/14; G08G 19/12
[52] U.S. Cl. .................... 340/870.28; 340/870.01; 340/870.17; 361/412; 361/415; 374/154
[58] Field of Search ............... 340/870.32, 870.34, 340/870.28, 870.29, 870.37, 672, 671, 870.01, 870.17; 361/395, 412, 415; 374/153, 154

[56] References Cited

U.S. PATENT DOCUMENTS 3,596,139  7/1971  Walsh .......................... 361/415
3,758,845  9/1973  MacKelvie .................. 340/870.32

Primary Examiner—James J. Groody
Attorney, Agent, or Firm—Brumbaugh, Graves, Donohue & Raymond

[57] ABSTRACT

In the transmission of measurement data from a rotating body to a stationary receiver, a rotary signal transmitter mounted on a rotating shaft employs a printed circuit. A printed circuit board assembly for the rotary transmitter has a plurality of evenly circumferentially distributed printed circuit boards which have their electronic components facing radially inwardly so as to resist damage due to centrifugal force resulting when the shaft and boards rotate. Connecting wires connect the assembly to a temperature sensor and the signal corresponding to the temperature is transmitted via a light-emitting element to a light-sensitive element of the receiver. Another arrangement employs rotationally balanced printed circuit discs extending radially. Multiplexing means may also be provided.

10 Claims, 8 Drawing Figures

DEVICE FOR TRANSMITTING MEASUREMENT DATA FROM A ROTATING BODY

BACKGROUND OF THE INVENTION

1. Technical Field of the Invention

This invention relates to a transmission system for detecting measurement data (i.e., temperature data) of a rotating body and for transmitting the measurement data from the rotating body to a stationary receiver via a contactless transmission path, and is particularly concerned with the structure of a printed circuit board assembly for a rotary transmitter in the measurement data rotary transmission system.

2. Description of the Prior Art

In the synthetic fiber industry, metal rollers generally called roll heaters are used which are heated by an induction heater and rotated by a motor at high speeds for drawing and heat-setting yarns. In order to produce yarns of good quality, the surface temperature of the roll heater should be controlled to be at an optimum for the yarn processing. It is necessary to accurately detect the surface temperature of the metal roller and to transmit the measurement data to a temperature control device for the roller. One known system includes a temperature sensor embedded in the metal roller which produces an output signal which is delivered externally, via a brush and slip ring, to a fixed stationary heater control device comprising a central processing unit. However, the latter arrangement does not enable the heater control device to pick up the output signal with stability and precision over a long period of time.

Since such a system fails to meet practical requirements, a contactless signal transmission system has been employed in the art. In the contactless system, the rotating body has a transmitter for converting a temperature sensor output to a predetermined signal form and for transmitting the latter to a stationary receiver via a contactless transmission path. Various contactless systems comprise such a transmitter.

In one system, a temperature sensor comprises a thermoresistor, whose resistance varies as a function of temperature. A Wien bridge detects the resistance of the resistor and converts it to a frequency signal, which is then transmitted through a rotary transformer to a stationary receiver.

In another contactless transmission system, a signal indicative of the resistance of the temperature sensor is amplified and frequency-modulated by a modulator and is transmitted to the stationary receiver via a transmission circuit and an aerial.

In yet another contactless transmission system, an output signal from the temperature sensor is converted to a corresponding frequency signal which is then converted by an electrooptical converter to a light signal that is optically transmitted from a light-emitting element to a photosensitive element associated with the stationary receiver.

A latter type of temperature signal transmission apparatus for transmitting light signals is shown in a schematic block circuit diagram in FIG. 1, and a roll heater utilizing such a temperature signal transmission apparatus is schematically illustrated in FIG. 2.

In the apparatus shown in FIG. 1, a temperature signal transmitter 1 is mounted on a roller of a roll heater and has a temperature sensor 2 which produces an output signal indicative of temperature. The output signal delivered through a voltage conversion circuit 3, an amplification circuit 4, a voltage-to-frequency conversion circuit 5, and an energization circuit 6 to a signal transmitter or a light-emitting element 7 which produces a light output signal. The temperature signal transmitter 1 is supplied with electrical power from a stationary receiver 11 through a secondary winding 8 or a rotary transformer serving as a power supply, a rectification circuit 9, and a constant-voltage supply circuit 10.

The stationary receiver 11 comprises a photosensitive element 12 disposed on the optical axis of the light-emitting element 7 and receives the light signal therefrom, and a conversion circuit 13 converts the light signal to an electric signal, which is delivered to a central processing unit 14 serving as a heater control device. The rotary transformer has a stationary primary winding 8'.

A roll heater equipped with the temperature signal transmission apparatus thus constructed is shown in FIG. 2. The roll heater comprises a metal roller 18 mounted on one end of a rotational shaft 16 of a drive motor 15 and arranged to be heated by a fixed induction heater coil 17, the metal roller 18 having the temperature sensor 2 embedded therein. The other end of the rotational shaft 16 supports the transmitter 1 which is electrically connected to the temperature sensor 2 by means of a wire 19 extending through a central axial bore in the rotational shaft 16. The receiver 11 and the primary winding 8' of the rotary transformer are supported on a frame projecting laterally from a casing of the motor 15. The temperature sensor may comprise thermally sensitive elements such as a thermistor or a thermocouple, as well a thermoresistor as mentioned above.

The circuits 3 to 6 of the transmission apparatus as shown in FIG. 1 are normally constructed as printed circuits which include various electronic components such as ICs, miniature capacitors, resistors, transistors and diodes mounted on printed circuit boards. These electronic parts are soldered to the boards via thin wires, and hence are mechanically unstable. The wires are prone to break under undue external forces applied accidentally, resulting in damage to the mounted parts. Accordingly, the printed circuits should be handled with care. Since the roll heater is rotated at high speeds while in operation, the electronic components assembled and mounted on the roller are subjected to considerable centrifugal forces. Therefore, there has been much concern about how to safeguard against centrifugal forces imposed on the electronic components of the transmitter.

Various attempts have been made to provide assembly structures for electronic components to be mounted on the roller. However, none of the prior proposals have met practical requirements, since the electronic components tend to give way under centrifugal forces which result when the roller revolves at high speeds. While efforts have been made to increase the mechanical strength by encasing the printed circuits in plastic material, such encasement of the parts is disadvantageous because the printed circuits cannot be inspected and the individual components cannot be replaced. Therefore, there is a need for a system which overcomes all of the problems of prior systems discussed above.

SUMMARY OF THE INVENTION

It is an object of the present invention to provide a simple, reliable and easily assembled measurement data transmission system for use on a rotary body which will better withstand centrifugal forces imposed while the rotary body is revolving at high speeds, thereby reducing the risk that the system will be damaged.

According to the present invention, there is provided a rotary printed circuit board assembly for a signal transmitter which is mounted on the rotational axis of a rotating body. The assembly comprises electronic components arranged on one or more printed circuit boards in such a way that centrifugal forces acting on the electronic components will have substantially no net vector component which directly urges the electronic components away from the plane of the printed circuit board.

A rotary signal transmitter can incorporate such an assembly mounted on a rotating shaft. A system for transmitting measurement data from a rotating body can include a rotary signal transmitter which receives measurement date from a sensor and transmits measurement data signals via a contactless transmission path to a stationary receiver, which in turn is connected to a data processing arrangement.

Preferably, in the assembly, the printed circuit boards and electrical components are arranged so as to be rotationally balanced along any diameter of the assembly.

In one embodiment of the assembly, the printed circuit boards each carry electrical components only on the mounting surface of the printed circuit board which faces radially inwardly. The assembly may include a bobbin-shaped attachment base having a pair of flanges, with the electronic parts being secured to the printed circuit board mounting surfaces which face radially inwardly, and with the printed circuit boards mounted on the pair of flanges and around the attachment base in a circumferentially spaced and cylindrical arrangement. In such an arrangement, each of said flanges is preferably polygonal with the printed circuit boards being secured to the polygon sides, the number of which corresponds to the number of printed circuit boards. It may be useful to provide a binder wound around the printed circuit board arrangement to fasten the latter together. Connection wires can conveniently interconnect adjacent mounting surfaces of the printed-circuit boards.

In another embodiment of the assembly, at least one printed circuit board has a disk shape which is mounted coaxially on a rotational shaft of the rotating body. If some of the electronic parts are elongated in shape, the longitudinal axes of the parts are preferably oriented radially. If some of the electronic parts have contacts, the parts are preferably oriented such that the contacts will be urged closed under centrifugal forces arising during rotation about the rotational axis. Advantageously, at least some of the electronic parts are identical in shape with each other and are disposed diametrically opposite each other with respect to the axis of rotation. The electronic parts can be mounted on a plurality of disk-shaped printed circuit boards, which are all mounted coaxially.

Either embodiment may include means for multiplexing a plurality of signals for transmission from the rotating body to the stationary body.

In one form of rotary signal transmitter, the printed circuit board assembly has a boss member on which is mounted a rotary transformer assembly comprising a secondary coil and a core, with a stationary power supply being provided for supplying an electric current through the rotary transformer to a signal conversion circuit of the transmitter.

In a convenient manner, the signal transmission device of the rotary signal transmitter comprises a light-emitting element, and an end attachment base removably secured to the axial end of the printed circuit board assembly to support the light-emitting element centrally thereon. The light-emitting element has its optical axis held in alignment with a central axis of the rotational shaft. The device may also include terminals mounted on the end attachment base on which the light-emitting element is supported, and connection wires which are connected to the terminals in order to interconnect a sensor and the printed circuit board assembly. The transmitter advantageously has a disk-shaped protective cover which covers the end attachment base on which the light-emitting element is mounted. The disk-shaped protective cover defines a central aperture through which the light-emitting element can transmit light, and defines openings for enabling visual inspection of the connection wires on the end attachment base.

If the printed circuit board assembly takes the form of the first embodiment mentioned above, the rotary signal transmitter may be arranged so that said printed circuit board assembly is secured to the rotational shaft by means of screws or pins which extend through radial bores defined in the flanges, with the bores located between adjacent printed-circuit boards so as not to be covered thereby. In such a case the transmitter may include a protective cover surrounding the printed circuit board assembly, with the protective cover having a diameter approximating the outside diameter of the assembly, and with the protective cover having holes at predetermined positions for enabling insertion therethrough of a screwdriver for turning the screws securing the printed circuit board assembly to the rotational shaft.

A system for transmitting measurement data from a rotating body may include more than one sensor connected to the rotary signal transmitter. In one such system a plurality of sensors are mounted on a single rotating body, and multiplexing means are provided comprising a time-sharing circuit for time-sharing the output signals from the sensors and supplying the time-shared signals to a signal conversion circuit for supplying signals for transmission from the rotating body to the stationary body.

In another such system a plurality of sensors are mounted respectively on different rotating bodies, with the signal transmitter for each rotating body having a light-emitting element, a receiver comprising a plurality of condenser lenses disposed in respective confronting relationships to the light-emitting elements, a fiber-optical cable connected optically between the condenser lenses and a central processing unit, and multiplexer means arranged to control light signals emitted from said light-emitting elements.

Numerous other advantages and features of the present invention will become readily apparent from the following detailed description of the invention and of several embodiments thereof, from the claims and from the accompanying drawings.

BRIEF DESCRIPTION OF THE DRAWINGS

Embodiments of the present invention will now be described in detail with reference to the accompanying drawings in which.

DETAILED DESCRIPTION OF THE PREFERRED EMBODIMENTS

Figure 1:
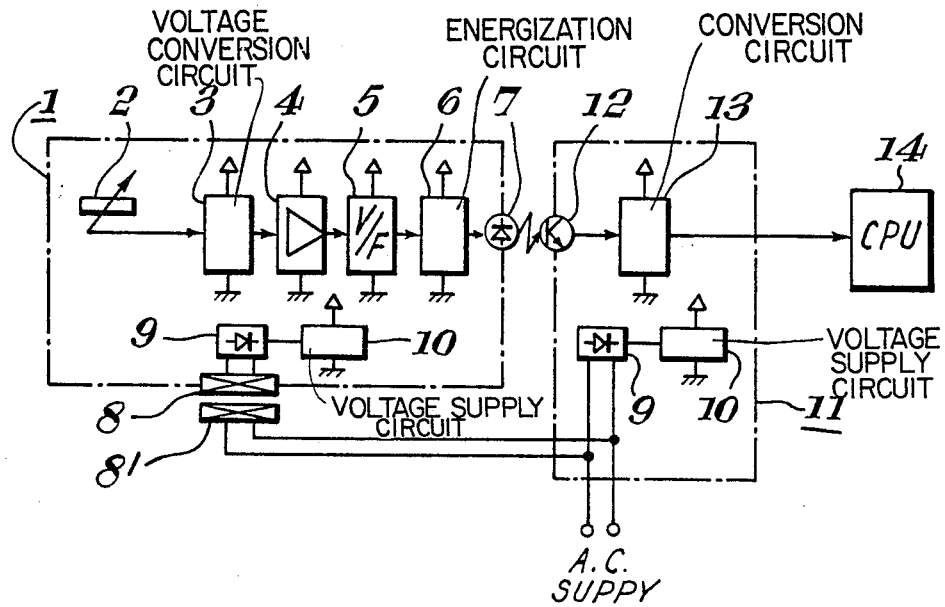
FIG. 1 is schematic block circuit diagram of a rotary signal transmission system as employed in the prior art.

While this invention is susceptible of embodiment in many different forms, there is shown in the drawings and will herein be described in detail one specific embodiment, and alternatives thereof, with the understanding that the present disclosure is to be considered as an exemplification of the principles of the invention and is not intended to limit the invention to the embodiments illustrated.

Figure 2:
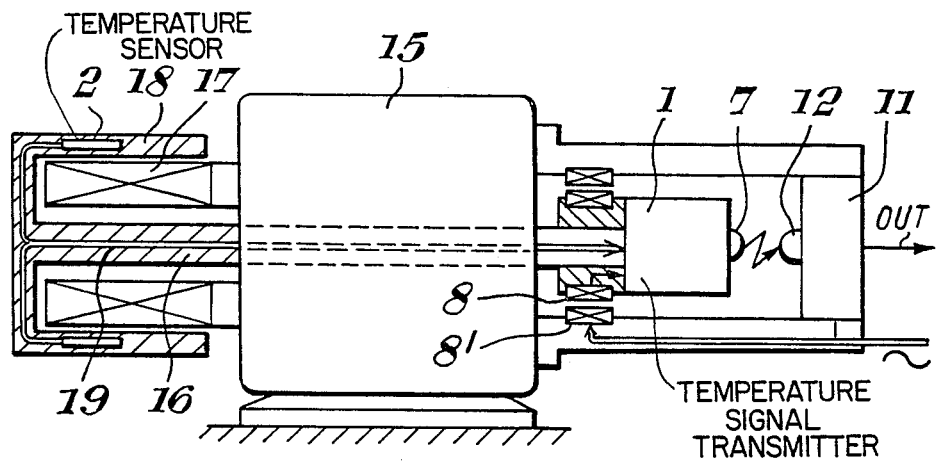
FIG. 2 is a cross-sectional view of a roll heater equipped with the system shown in FIG. 1.
Figure 3:
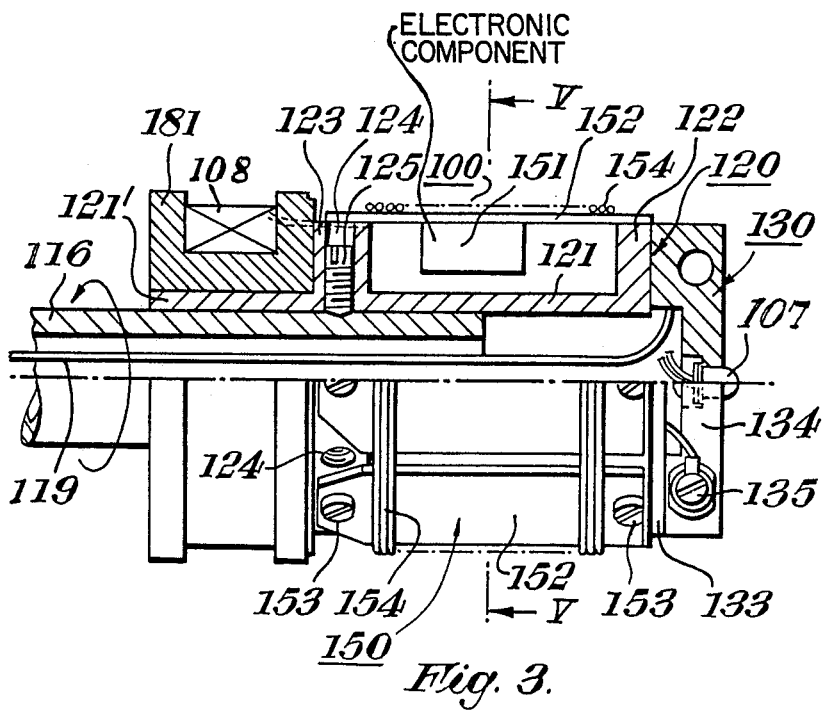
FIG. 3 is a side elevation, with the upper half in cross section, of a portion of a rotary signal transmitter embodying this invention.

In the following description, two digit numerals are used to refer to the prior art device illustrated in FIGS. 1-2, and three digit numerals in the one hundred series are used to refer to the embodiment illustrated in FIGS. 3-8. The same last two digits in each numeral usually but not necessarily designate similar or functionally analogous elements in the various embodiments.

In FIGS. 3 to 8, a signal transmitter 100 mounted on a rotational shaft 116 of a drive motor comprises an attachment base 120 for a printed circuit, an attachment base 130 for a light-emitting element, a protective cover assembly 140, a printed circuit 150 mounted on the attachment base 120 and serving as a signal conversion circuit, a signal transmission or light-emitting element 107 mounted on the attachment base 130, and a secondary coil 108 and annular core 181 of a rotary transformer which is to provide connection to a power supply.

The attachment base 120 can be molded of aluminum, for example, and includes a boss member 121 fitted over the rotational shaft 116 and a pair of larger-diameter flanges 122, 123 located respectively at one end of the boss 121 and at an intermediate position thereon. Thus, the attachment base 120 assumes a bobbin shape. The boss 121 has an axial entension 121', extending leftward (as shown) of the flange 123 and supporting thereon the rotary transformer.

The flanges 122, 123 have outer peripheral surfaces serving as seats for printed circuit boards as described later and are each cut in the shape of a regular polygon (a regular hexagon in the illustrated embodiment) with the number of polygon sides depending on the number of printed circuit boards to be mounted. The intermediate flange 123 defines two threaded bores 124 extending radially inwardly from vertices of the polygonal shape and receives set screws 125 to fix the attachment base 120 to the rotational shaft 116. The vertices of the polygonal flange 123 are provided with flats to facilitate formation of the threaded holes 124. The core 181 on which the secondary winding 108 of the rotary transformer is wound is fitted over the boss extension 121' of the attachment base 120.

The attachment base 130 is made of an electrically insulating material and is removably secured to an end surface of the flange 122 of the attachment base 120 by means of bolts 131 (FIG. 4) having threaded recesses in their heads. The attachment base 130 includes a disk-shaped base plate 133 having a central aperture 132 for passage therethrough of connection wires, and an attachment base portion 134 integral with the base plate 133 and elongated diametrically of the transmitter, with the base portion 134 projecting axially from the surface of the base plate 133. The attachment base portion 134 supports the light-emitting element 107 fitted therein which has its optical axis aligned with the central axis of the rotational shaft 116. The attachment base 130 also acts as a terminal base in that the attachment base portion 134 has terminals 135 on its sides to which are connected wires 119 connected to a temperature sensor. Designated at 136 are apertures communicating with the interior of the bobbin-shaped attachment base 120 for passage therethrough of connection wires. The terminals 135 are attached to the sides of the attachment base 130 so that they can be screwed from the side. The terminals 135 are directed generally in the direction in which the rotary body rotates, thereby reducing the risk that the connection wires will be displaced upon rotation of the rotary body.

The protective cover assembly 140 comprises a cylindrical cover 141 surrounding the periphery of the attachment base 120, and a cup-shaped cover 142 axially covering the attachment body 130. The cylindrical cover 141 has one end fitted in a step on a shoulder of the core 181 of the rotary transformer and the other end held in engagement with the cup-shaped cover 142. The cup-shaped cover 142 is secured in position by means of bolts 143 which have screw-threads engaging the threaded recesses in the heads of the bolts 131 which attach the base 130 to the base 120. The cylindrical cover 141 has holes 144 for enabling insertion of a screwdriver for turning the set screws 125 with the cylindrical cover 141 still in place. The cup-shaped cover 142 has a central opening through which the light-emitting element is exposed, and side openings 145 through which the connection wires can be visually inspected. When the connection wires are to be connected to the terminals, the cup-shaped cover 142 can be removed via a clearance between the light-emitting element and a photosensitive element which receives the light from the light-emitting element.

The printed circuit 150 will now be described. The printed circuit 150 comprises electronic components 151 which are securely mounted on a mounting surface of each of a plurality (six in the illustrated embodiment) of rectangular printed circuit boards 152. The printed circuit boards 152 are arranged around the circumference of the attachment base 120 so that the mounting surfaces face radially inwardly. The boards 152 extend between the polygonal flanges 122, 123 and are secured to the outer faces of the polygonal flanges 122, 123 by means of bolts 153. With the printed circuit boards 152 secured in place, the electronic components 151 are accommodated in a space defined by the boss 121 and flanges 122, 123. The printed circuit boards 152 have corners angled to provide spaces between adjacent boards which are large enough to expose the screw holes 124 for receiving the set screws 125 which attach the attachment base 120 to the rotational shaft 116.

The printed circuit boards 152 mounted on the attachment base 120 are securely fastened together by means of a binding member 154 wound therearound to reinforce the boards 152 and so increase their mechanical strength against centrifugal forces imposed on the boards 152 when the rotary body is revolving. The binding member 154 may comprise an insulating yarn or tapes. In some cases, the printed circuit boards 152 may be secured to the base 120 solely by means of the binding member 154, and the bolts 153 may be dispensed with. With this modified arrangement, the flanges 122, 123 may be provided with radially inward recesses into which the ends of the printed circuit boards 152 can be fitted so that the boards 152 seat on the bottoms of the recesses, thus preventing the printed circuit boards 152 from being displaced circumferentially or axially. Alternatively, the binding member 154 may be dispensed with, and the printed circuit boards 152 may be held in position against centrifugal forces by means of the cylindrical protective cover 141.

The diameter of the cylindrical cover 141 of the protective cover assembly 140 is only slightly larger than the diameter of the outside of the assembly of the attachment base 120 and the printed circuit boards 152. In such an arrangement, if the set screws 153 become loose and tend to disengage from the boards 152 while the transmitter is revolving, the screws will hit the inner surface of the cylindrical cover 141 and will be prevented from flying away.

Figure 4:
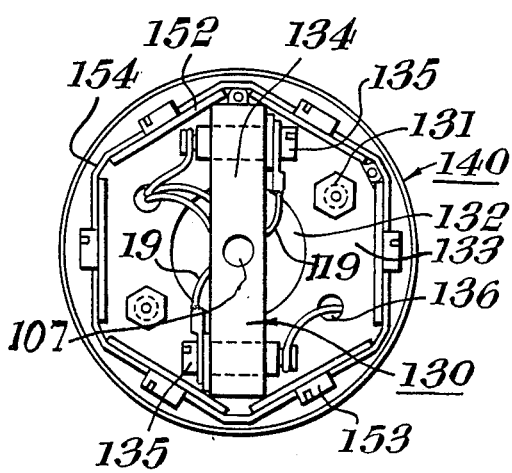
FIG. 4 is an end view of the transmitter shown in FIG. 3.
Figure 5:
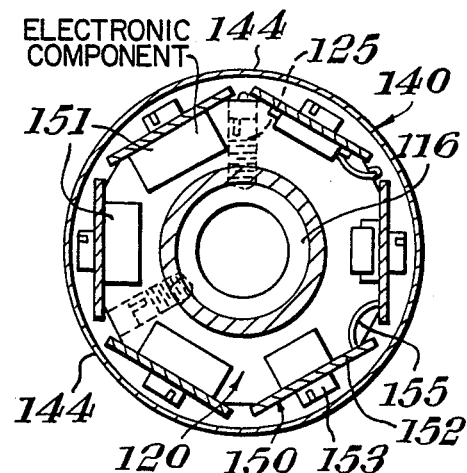
FIG. 5 is a cross-sectional view taken along the line V—V of FIG. 3.
Figure 6:
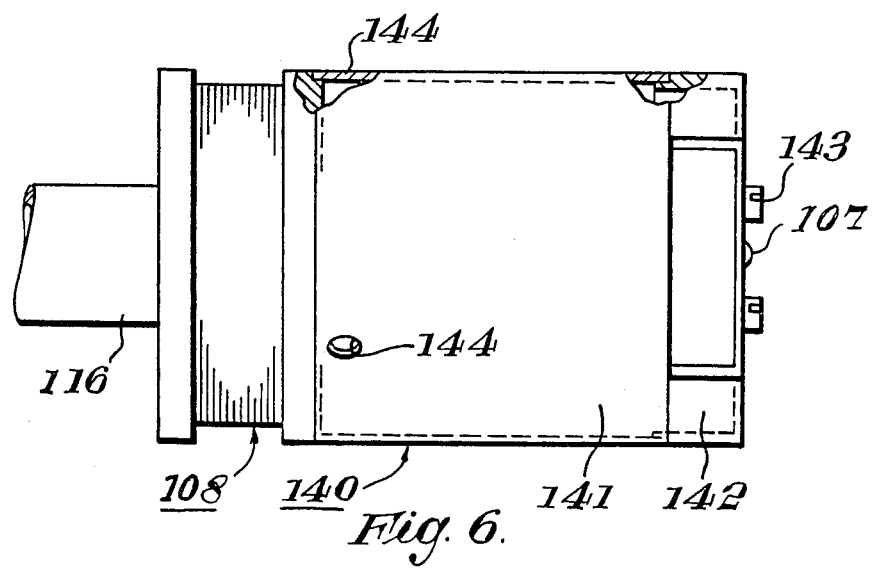
FIG. 6 is a side elevation of the transmitter with a protective cover assembly.
Figure 7:
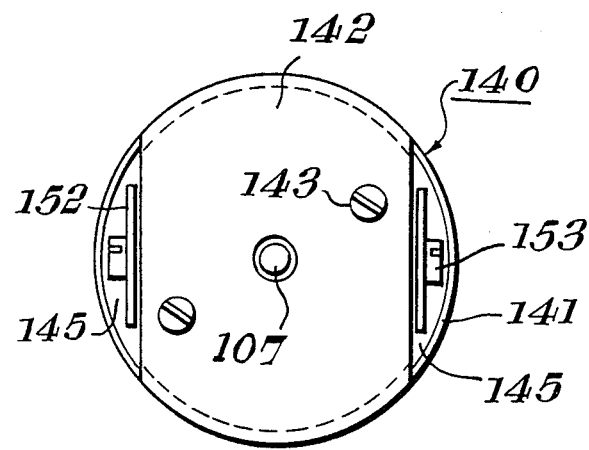
FIG. 7 is an end view of the transmitter shown in FIG. 6.

The connection of wires in the signal transmitter 100 will now be described. The wires 119 extending from the non-illustrated temperature sensor through a central axial bore in the rotatable shaft 116 of the motor and through the central aperture 132 in the attachment base 130, are connected to the printed circuit 150 by means of connection wires extending through the apertures 136 in the attachment base 130, as shown in FIG. 4. The printed circuit 150 is connected to the light-emitting element 107 by means of connection wires extending through one of the apertures 136. The printed circuit boards 152 are electrically interconnected by means of connection wires 155 which extend on the same side as the component-mounting surfaces of the boards 152, as illustrated in FIG. 5. The crossover connection wires 155 thus connected between the boards 152 are thus inhibited from being forced off the boards 152 under the action of centrifugal forces.

Figure 8:
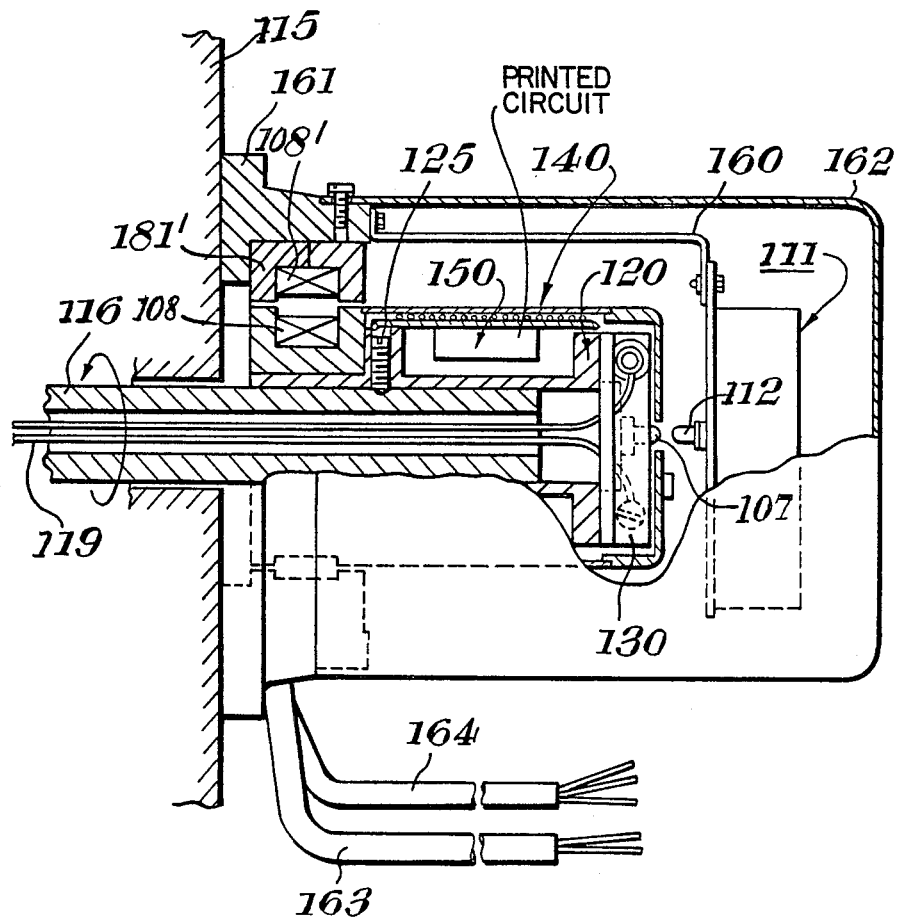
FIG. 8 is a side elevation, with parts in cross section, of a portion of a roll heater system embodying the signal transmitter shown in FIG. 3.

FIG. 8 illustrates an assembled transmission system as a whole. A receiver 111 is supported on a stationary bracket of a drive motor 115 by means of a support arm 160 and a flange 161 so that the receiver 111 is stationary with respect to the environment. The transmitter 100 rotates with respect to the receiver 111. The receiver 111 has a photosensitive element 112 whose optical axis is aligned with that of the light-emitting element 107 in the transmitter 100. The flange 161 supports thereon an assembly comprising a primary winding 108' of the rotary transformer which extends around the secondary winding 108, and an annular core 181' surrounding the secondary winding 108', the assembly being partially fitted into and secured by means of screws to the flange 161. The flange 161 projects axially but such that it will not interfere with turning of the set screws 125 in the attachment base 120 with a screwdriver. The transmitter 100 and the receiver 111 are protected by means of a dust cover 162 secured by means of screws to the flange 161. Connection wires 163, 154 are connected to the primary winding of the rotary transformer and to the output of the receiver 111, respectively.

Thus, with the above-described embodiment, the printed circuit in the transmitter comprises a plurality of printed circuit boards on which electronic components are securely mounted on circuit board surfaces which face radially inwardly, with the printed circuit boards being secured to and spaced circumferentially around the attachment base at equal intervals. When the rotary body is rotated at high speeds, the electronic components are subjected to centrifugal forces which cause the components to be pressed against and supported by the printed circuit boards, with the result that the connection wires between the electronic components, which are mechanically weak, and portions of the connection wires which are soldered to the printed circuit boards will not be subjected to undue loads which would otherwise damage them, and hence have increased resistance to damage due to centrifugal forces. The printed circuit boards are circumferentially spaced equally around the rotational shaft of the rotary body and have a small radius of rotation, so that they do not impose an unbalanced load on the rotary body (particularly the drive motor) and enable smooth high-speed operation of the rotary body. The printed circuit boards, attachment base for the light-emitting element, rotary transformer, and protective cover assembly are supported and structured so that the rotary transmission system is reliable in operation and can be assembled and handled readily.

It is apparent that the transmitters 100 and 200 described above include printed circuit board assemblies in which the electronic components are arranged on the printed circuit boards in such a way that, in use, the centrifugal force acting on the electronic components has no net component directly urging the electronic components away from the plane of the relevant printed circuit board. Thus, a much more stable and secure configuration is obtained than when the components are secured to radially outer surfaces of the printed circuit boards. This reduces significantly the risk of damage to the printed circuit assembly.

From the foregoing, it will be observed that numerous variations and modifications may be effected without departing from the true spirit and scope of the novel concept of the invention. It is to be understood that no limitation with respect to the specific embodiments illustrated herein is intended or should be inferred. It is, of course, intended to cover by the appended claims all such modifications as fall within the scope of the claims.

What is claimed is:

1. An apparatus for a signal transmitter for mounting on the axis of rotation of a rotating body, comprising a rotary printed circuit board assembly further comprisprising at least two generally planar printed circuit boards having electronic components mounted thereon, said circuit boards being mounted in said assembly so that when the rotating body rotates, the resultant centrifugal force acting on the electronic components will be substantially free of net vector force components directly urging the electronic components away from the plane of the printed circuit boards, including a bobbin-shaped attachment base having a pair of flanges, and wherein components are secured and mounted to the surfaces of said printed circuit boards which face radially inwardly, and wherein said printed circuit boards are mounted on said pair of flanges and around said attachment base in a circumferentially spaced and cylindrical arrangement.

2. The apparatus according to claim 1, wherein at least three printed circuit boards are provided, and wherein each of said flanges is polygonal having a number of sides equal to the number of circuit boards, and wherein each printed circuit board is secured to a different polygonal side.

3. The apparatus according to claim 1, including a binder wound around the arrangement of said printed circuit boards to fasten the boards together.

4. The apparatus according to claim 1, wherein the printed circuit boards are secured to the flanges by means of screws.

5. An apparatus for a signal transmitter for mounting on the axis of rotation of a rotating body, comprising a rotary printed circuit board assembly further comprising at least one generally planar printed circuit board having electronic components mounted thereon, said circuit board being mounted in said assembly so that when the rotating body rotates, the resultant centrifugal force acting on the electronic components will be substantially free of net vector force components directly urging the electronic components away from the plane of the printed circuit board, wherein the rotating body comprises a rotational shaft and the printed circuit board assembly is mounted on the rotational shaft, wherein the signal transmitter is a signal transmission device comprising a light-emitting element, and end attachment base removably secured to the axial end of the printed circuit board assembly and which centrally supports the light-emitting element, said light-emitting element having its optical axis held in alignment with a central axis of the rotational shaft.

6. A signal transmitter apparatus mounted on a rotating body, comprising a rotary printed board assembly which further comprises at least two generally planar printed circuit boards each mounted in a plane generally normal to a radial line originating at the rotational axis of the rotational body and with the electrical component mounting surface of the board facing radially inwardly, whereby the electrical components are substantially free of net vector force components urging the components away from the plane of their printed circuit board when the rotating body rotates, including a bobbin-shaped attachment base having a pair of flanges, and wherein components are secured and mounted to the surfaces of said printed circuit boards which face radially inwardly, and wherein said printed circuit boards are mounted on said pair of flanges and around said attachment base in a circumferentially spaced and cylindrical arrangement.

7. The apparatus according to claim 6, wherein at least three printed circuit boards are provided, and wherein each of said flanges is polygonal having a number of sides equal to the number of circuit boards, and wherein each printed circuit board is secured to a different polygonal side.

8. The apparatus according to claim 6, including a binder wound around the arrangement of said printed circuit boards to fasten the boards together.

9. The apparatus according to claim 6, wherein the printed circuit boards are secured to the flanges by means of screws.

10. A signal transmitter apparatus mounted on a rotating body, comprising a rotary printed board assembly which further comprises at least one generally planar printed circuit board mounted in a plane generally normal to a radial line originating at the rotational axis of the rotating body, and with the electrical component mounting surface of the board facing radially inwardly, whereby the electrical components are substantially free of net vector force components urging the components away from the plane of their printed circuit board when the rotating body rotates, wherein the rotating body comprises a rotational shaft and wherein the printed circuit board assembly is mounted on the rotational shaft, wherein the signal transmitter is a signal transmission device comprising a light-emitting element, and an end attachment base removably secured to the axial end of the printed circuit board assembly and which centrally supports the light-emitting element, said light-emitting element having its optical axis held in alignment with a central axis of the rotational shaft.

* * * * *